(12) United States Patent
Saunders

(10) Patent No.: US 7,988,136 B2
(45) Date of Patent: Aug. 2, 2011

(54) STAGE DEVICE FOR A VACUUM CHAMBER

(75) Inventor: Ian Saunders, Chadstone (NL)

(73) Assignee: Mapper Lithography IP B.V., Delft (NL)

( * ) Notice: Subject to any disclaimer, the term of this patent is extended or adjusted under 35 U.S.C. 154(b) by 1398 days.

(21) Appl. No.: 10/510,082

(22) PCT Filed: Apr. 2, 2003

(86) PCT No.: PCT/NL03/00247
§ 371 (c)(1),
(2), (4) Date: Nov. 28, 2007

(87) PCT Pub. No.: WO03/083909
PCT Pub. Date: Oct. 9, 2003

(65) Prior Publication Data
US 2008/0219805 A1 Sep. 11, 2008

(51) Int. Cl.
*B25B 1/00* (2006.01)
(52) U.S. Cl. ............. 269/11; 269/58; 254/122; 254/126
(58) Field of Classification Search .................... 269/11, 269/58, 48, 900; 254/122–126
See application file for complete search history.

(56) References Cited

U.S. PATENT DOCUMENTS

| | | | | |
|---|---|---|---|---|
| 5,201,501 A * | 4/1993 | Fassler | ............................. | 269/32 |
| 5,771,516 A * | 6/1998 | Huang | ............................. | 7/100 |
| 5,975,497 A * | 11/1999 | Few et al. | ..................... | 254/126 |
| 6,279,885 B1 * | 8/2001 | Leon, Jr. | ............................. | 269/8 |
| 6,334,605 B1 * | 1/2002 | Kikuchi | ......................... | 254/126 |
| 7,168,693 B1 * | 1/2007 | Sjuts et al. | ....................... | 269/37 |
| 2002/0084660 A1 * | 7/2002 | Webber | ............................ | 294/97 |
| 2008/0219805 A1 * | 9/2008 | Saunders | ...................... | 414/217 |

* cited by examiner

*Primary Examiner* — Lee D Wilson
(74) *Attorney, Agent, or Firm* — Morgan, Lewis & Bockius LLP

(57) ABSTRACT

The disclosure relates to a transfer stage for moving an object in a vacuum chamber in at least a plane of movement, including at least a first and a second rod each having a first and a second end, the first and second rod being connected one to the other with their first ends by a first hinge, the second end of the first rod being provided with a first hinged support and the second end of the second rod being provided with a second hinged support, the first and second hinged supports being roller supports and the first hinge being provided with a short stroke stage for the object. Particularly when using this transfer stage in lithography systems fast and reliable movements are possible.

20 Claims, 2 Drawing Sheets

STAGE DEVICE FOR A VACUUM CHAMBER

The invention relates to a movement or transfer stage for moving an object in a vacuum chamber in at least a plane of movement.

The moving of an object in a vacuum chamber in a plane of movement is a complex problem. Often the transfer stages have been provided with lubricants, which will lead to pollution in a vacuum chamber.

Especially when the movement has to take place fast, such for instance in lithography uses, big design problems arise. Various solutions are known, each having their own specific problems.

For instance it is known to pass two continuous shafts through the walls of a vacuum chamber, the first shaft only being movable in its longitudinal direction, and the second shaft being attached to said first shaft perpendicular to the movement of the first shaft, also moveable in its longitudinal direction. A chuck for the object has been attached to said second shaft. This structure requires large passages through the walls of the vacuum chamber, which in turn necessitates large pumping capacity to maintain the vacuum. In addition the bearing structure is complex, and the stage will become heavy due to its construction.

Another known solution is magnetic actuation. The presence of the considerable magnetic fields, in particular near the object that has to be moved, may in many cases be undesirable however.

It is an object of the invention to at least partially overcome the drawbacks mentioned.

To that end the invention provides a transfer stage for moving an object in a vacuum chamber in at least a plane of movement, comprising at least a first and a second rod each having a first and a second end, the first and second rod being connected one to the other with their first ends by means of a first hinge, the second end of the first rod being connected to first drive means for moving said second end, the second end of the second rod being connected to second drive means for moving said second end and the first hinge being connected to attachment means for the object.

The transfer stage according to the invention makes a reliable and stable movement of the object in a vacuum chamber possible. In addition it is possible by means of the transfer stage to realise very fast movements in which large accelerations occur. These advantages are of importance, particularly when the transfer stage is used in a lithography system for applying patterns on for instance semiconductor substrates for chips, the vacuum chamber being a part of the lithography system.

When using the transfer stage in a vacuum chamber that is a part of the lithography system, the transfer stage will make the "large" movements in the vacuum chamber possible. The transfer stage in that case is a part of or is the so-called "long stroke wafer stage". Said long stroke wafer stage moves the waver approximately 300-700 mm. It is of great importance here that the device is stable, up to less than some microns.

In general the object that is moved will be a semiconductor substrate or wafer. Such a wafer being attached to a chuck, by means of which the wafer has been aligned with respect to a lithography device. The chuck in turn is attached to various movement tables and rotation tables by means of which small movements and rotations can be carried out. Such parts are known to the expert under the name "short stroke wafer stage".

In an embodiment of the transfer stage according to the invention, the first and second drive means are adapted for moving the second ends of the first and second rod, respectively, along a common path. As a result the movement of the first hinge can easily be predicted. In a further embodiment the first and second drive means are adapted for moving the second ends of the first and second rod, respectively, along a line. As a result movement in a plane can easily be realised. This can be further improved when the first and second drive means are adapted for moving the two ends of the first and second rod, respectively, along one common line. In a further embodiment thereof the first and second drive means are adapted for moving the second ends of the first and second rod, respectively, along one common straight line. As a result a stable movement with as few disruptions as possible can be accomplished.

In an embodiment of the transfer stage according to the invention, the second ends of the first and second rod are provided with a second and third hinge, respectively, which hinges are connected to the drive means. As a result the drive means are able to simply move the second ends along one line, as a result of which a reliable movement becomes possible.

In an embodiment of the transfer stage at least one of the second and third hinge has been provided with means for the adjustable locking of said hinge. As a result the possibility is offered to make the movement in an X-direction and a Y-direction independent (i.e. uncoupling).

In another embodiment of the transfer stage, or possibly an embodiment of the transfer stage to be combined, the first and second drive means are provided with control means for adjustable synchronously and a-synchronously driving the second ends of the first and second rod. As a result a possibly additional possibility is offered to uncouple the movement in the X-direction and the Y-direction and thus to realise movement in a plane.

In an embodiment of the transfer stage the first and second drive means comprise a first and second drive rod, respectively, which each run through a wall of the vacuum chamber by means of at least one passage, the drive rods being moveable in their longitudinal direction and at one end being connected to the second and third hinge, respectively. As a result the movement is possible by means of drive means outside the vacuum chamber.

In an embodiment of the transfer stage according to the invention, it furthermore comprises a third and fourth rod each having a first and a second end, the third and fourth rod being connected one to the other with their first ends by means of a fourth hinge and the second end of the third rod being connected to the second hinge and the second end of the fourth rod being connected to the third hinge. As a result the possibility is created of designing the transfer stage symmetrically. It has appeared that as a result a more accurate movement can be realised. In addition a larger productivity is possible when the fourth hinge is connected with attachment means for a second object. In this way for instance the second object can be aligned, while the first object is being treated. In an embodiment of this transfer stage the first, second, third and fourth rod together form a parallelogram. In this way a stable movement is possible, with as few as possible vibrations and deviations due to torsion and other forces. In a further embodiment the hinges are supported, for instance on air bearings or otherwise.

In an embodiment of the transfer stage according to the invention it further comprises a third and fourth rod, the first, second, third and fourth rod being connected hinging one to the other in the shape of a parallelogram and the first and second drive means being adapted for adjustable change of the shape or the position of the parallelogram. As a result a stable and simple movement can be realised, without polluting the vacuum.

In a further embodiment the transfer stage is furthermore provided with a fifth rod, substantially parallel to the first rod and a sixth rod substantially parallel to the fourth rod, the fifth rod being connected to the first hinge and the third hinge, and the sixth rod being connected to the third hinge and the fourth hinge. In this way possible rotation of the first hinge and the fourth hinge, during movement, can be avoided.

In an embodiment of the transfer stage the drive means are flexibly connected to the ends of the rods. In an embodiment thereof the drive rods are magnetically connected to the ends of the rods.

According to another aspect of the invention the invention relates to a transfer stage for moving an object in a vacuum chamber in at least a plane of movement, comprising at least four rods, connected with their ends and forming a parallelogram, two opposite first and second vertices of the parallelogram being connected to drive means for moving said vertices along one line and the remaining two opposite third and fourth vertices being provided with means for retaining at least one object. Due to the symmetrical design a stable and predictable and reproducible movement is possible.

According to another aspect of the invention the invention relates to a transfer stage for moving at least one object in a vacuum chamber, comprising
- four elements connected one to the other by means of hinges, the hinges defining a parallelogram and being situated in one plane;
- at least one drive means, adapted for moving two opposite hinges with respect to each other along the connection line between both hinges, and for moving two opposite hinges jointly;
- connection means for connecting an object to a hinge.

In an embodiment thereof a drive means is adapted for both moving two hinges with respect to each other and moving two hinges jointly. In a further particularisation a drive means is adapted for moving two opposite hinges both with respect to each other and jointly.

The invention will be elucidated on the basis of an exemplary embodiment of a transfer stage according to the invention, in which.

Figure 1:
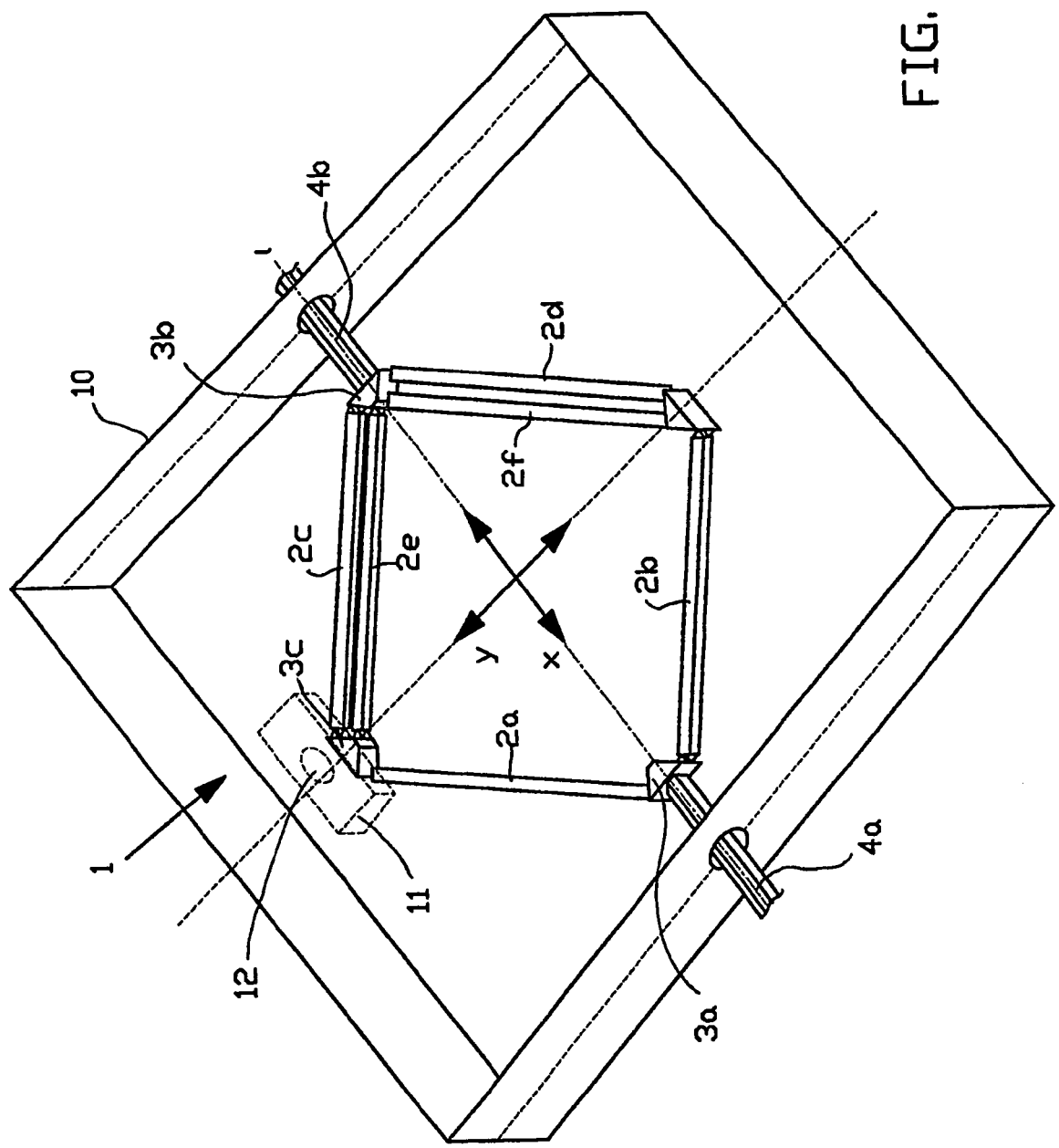
FIG. 1 shows a top view of a transfer stage according to the invention.

FIG. 1 shows a top view of an embodiment of a transfer stage 1. The transfer stage is in a vacuum chamber 10, wherein drive rods 4a and 4b extend outside of the vacuum chamber by means of passages in the walls, that are known per se. As a result drives can be kept outside of the vacuum.

In the view it can be seen how rods are connected hinged one to the other in the shape of a parallelogram. The rods 2a-2f are connected in a hinging manner by means of corner pieces 3a-3d. For preventing rotation when moving the corner pieces 3a and 3b extra rods 2e and 2f have been arranged parallel to rods 2c and 2d.

When using the device in lithography systems, so-called short stroke stages (shown in dots with number 11, provided with a wafer 12) are arranged on the corner pieces 3c and 3d. By means of the transfer stage the corner pieces 3c and 3d can be moved in both the X-direction and the Y-direction (shown in the figure). The stages have been designed double in one embodiment, one on each corner piece, so that during the treatment of one wafer the other can be aligned on the stages, which increases the productivity. In addition it is preferred that the device is designed as symmetrical as possible with respect to line I, because thus when operative as few vibrations and deformations as possible occur.

The vertices 3a and 3b here are rigidly connected to drive rods 4a and 4b. However it is also possible to transfer the motion of the drive rods on the vertices 3a and 3b via magnetic coupling or in another way. In this embodiment the rods are further situated in line with each other. The rods 4a and 4b are passed outside of the vacuum chamber by means of passages in the walls of a vacuum chamber, not shown here. Outside of the vacuum chamber the rods 4a and 4b are connected to drive means that are able to move the rods each in their extension in the direction of their respective longitudinal axis I. As a result no drive means are necessary in the vacuum chamber which means may cause pollution, and may have other disadvantageous effects such as generating disrupting electric and or magnetic fields near the object.

The operation of the transfer stage 1 is as follows. By moving the drive rods 4a and 4b along their longitudinal axis I, not only corner pieces 3a and 3b are moved, but also corner pieces 3c and 3d: When the drive rods 4a and 4b are moved just as fast in the same direction, a movement of the corner pieces 3c and 3d occurs in the X-direction. The parallelogram does not change shape here.

When however, the drive rods are moved in opposite direction with respect to each other (but indeed along the same common longitudinal axis I), the parallelogram changes shape, in that sense that the angles between the rods change. The parallelogram shape is maintained here. The consequence of this change of shape however is that the corner pieces 3c and 3d are moved in the Y-direction. This effect can be achieved by keeping one drive rod 4a, 4b still, or by varying the mutual speed.

By now moving the drive rods 4a and 4b with mutually different speed along their common longitudinal axis I a movement of the corner pieces 3a and 3d occurs in the XY-plane.

Figure 2:
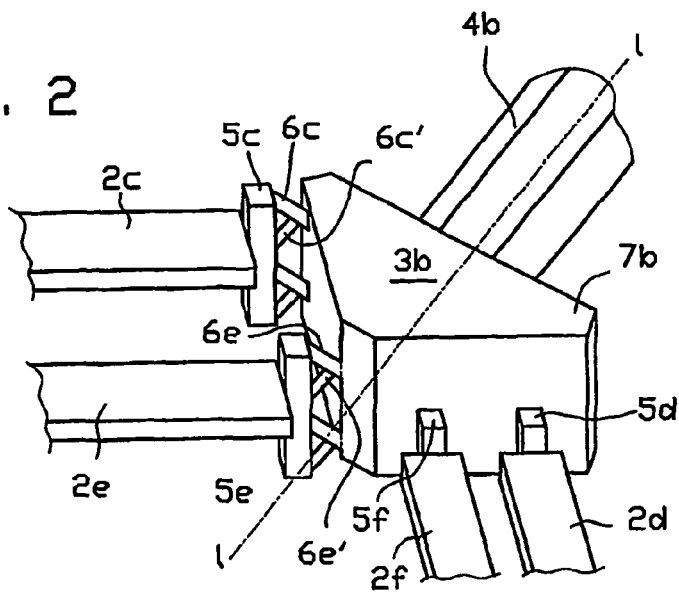
FIG. 2 shows a detail view of an corner piece of the transfer stage of FIG. 1.

FIG. 2 shows corner piece 3b in detail. The rods 2c, 2d, 2e and 2f are connected to corner piece 3b by means of connections blocks 5c, 5d, 5e and 5f. The connection blocks 5c, 5d, 5e and 5f in turn are connected to a central body 7b by means of double designed hinges, so-called Celtic Hinges®, 6c, 6c', 6e, 6e', 6f, 6f', 6d, 6d'. Due to the springy hinges possible deformations during the moving are compensated for in the hinges, so that they are not transferred to the wafer. Furthermore the double design prevents further deformations. The central body 7b, the hinges 6c-6f' and the connection blocks 5c-5f together form corner piece 3b.

Figure 3A:
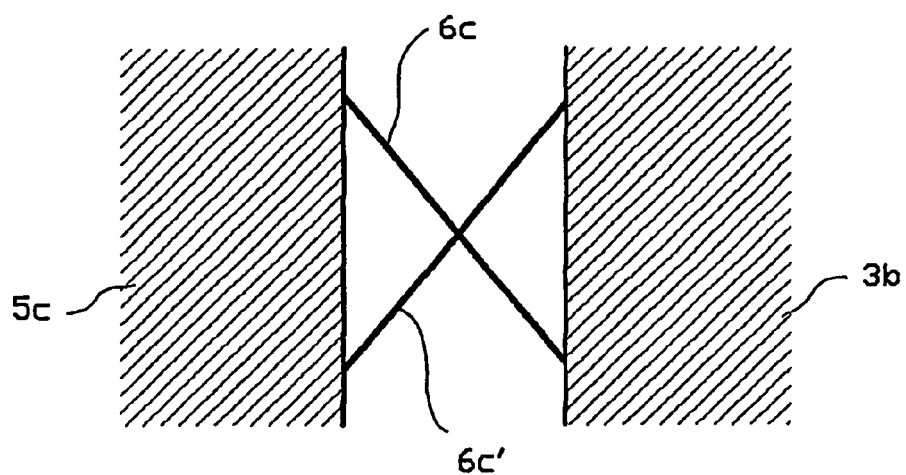
FIG. 3A shows a top view of a hinge of FIG. 2.
Figure 3B:
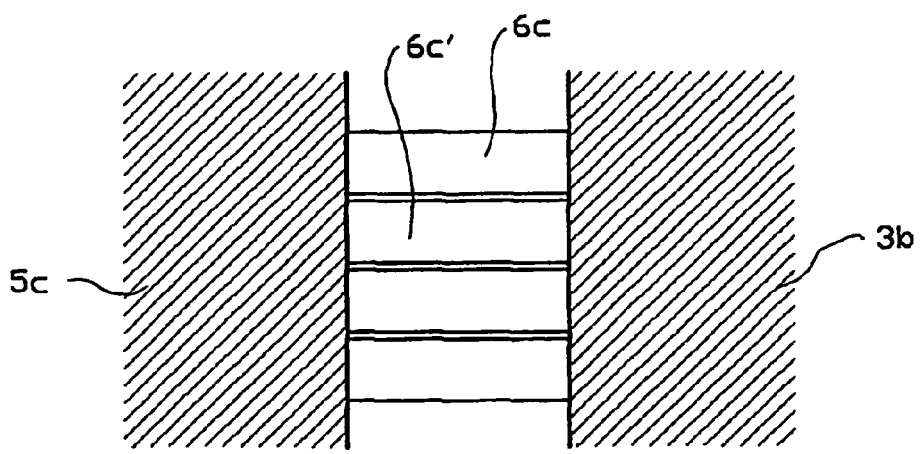
FIG. 3B shows a side view of a hinge of FIG. 2.

In FIGS. 3A and 3B detail views of the hinges can be seen in top view (FIG. 3A) and side view (FIG. 3B). Each part 6c and 6c' is a leaf spring. Due to the specific design as little disruption as possible occurs during the operation of the transfer stage, because the hinges are flexible and elastic. Due to the shape a high degree of rigidity is ensured.

To overcome further rotations or to compensate for them one or more rods or connection blocks may be provided with elements to adjust the length of the rods, for instance piezo elements that are known per se.

The corner pieces 3a-3d in one embodiment have been made of titanium. In connection with weight reduction the central bodies 7 are hollow. In an embodiment the corner pieces have each been formed out of one single piece of titanium, by means of sparkle erosion. Hinges 6 have also been integrally formed therewith.

In a further embodiment the rods 2a-2f as well as the drive rods 4a and 4b have been made of carbon fibre reinforced synthetic material, and preferably are hollow.

The invention claimed is:

1. A lithography system, comprising:
a vacuum chamber; and
a transfer stage for moving an object in said vacuum chamber in a plane of movement, said transfer stage comprising at least a first rod and a second rod each having a first and a second end, the first and second rod being connected one to the other with their first ends by means of a first hinge, the second end of the first rod being flexibly connected to a first drive rod for moving said second end, the second end of the second rod being connected to second drive rod for moving said second end, the first hinge being connected to a short stroke stage for the object, and the first and second drive rods being movable in the directions of their respective longitudinal axes.

2. The lithography system according to claim 1, the first and second drive rods being adapted for moving the second ends of the first and second rod, respectively, along a line in opposite directions.

3. The lithography system according to claim 1, the second ends of the first and second rod being provided with a second and third hinge, respectively, which hinges are connected to the drive rods.

4. The lithography system according to claim 3, at least one of the second and third hinge being provided with adjustable locks for the adjustable locking of said hinge.

5. The lithography system according to claim 1, the first and second drive rods being provided with a controller for adjustable synchronously and a-synchronously driving the second ends of the first and second rod.

6. The lithography system according to claim 3, wherein the first and second drive rods each run through a wall of the vacuum chamber by means of at least one passage, the drive rods being moveable in their longitudinal direction and at one end being connected to the second and third hinge, respectively.

7. The lithography system according to claim 3, furthermore comprising a third and fourth rod each having a first and a second end, the third and fourth rod being connected one to the other with their first ends by means of a fourth hinge and the second end of the third rod being connected to the second hinge and the second end of the fourth rod being connected to the third hinge.

8. The lithography system according to claim 7, the first, second, third and fourth rod together forming a parallelogram.

9. The lithography system according to claim 1, further comprising a third and fourth rod, the first, second, third and fourth rod being connected hinging one to the other in the shape of a parallelogram and the first and second drive rods being adapted for adjustable change of the shape or the position of the parallelogram.

10. The lithography system according to claim 3, further comprising a fifth rod, substantially parallel to the first rod and a sixth rod substantially parallel to the fourth rod, the fifth rod being connected to the first hinge and the third hinge, and the sixth rod being connected to the third hinge and the fourth hinge.

11. The lithography system comprising:
a vacuum chamber; and
a transfer stage for moving an object in the vacuum chamber in at least a plane of movement, the transfer stage comprising at least four rods, connected with their ends for forming a parallelogram, two opposite first and second vertices of the parallelogram being connected to drive rods for moving said vertices along one line and the remaining two opposite third and fourth vertices being provided with a chuck for retaining at least one object.

12. Transfer stage for moving at least one object in a vacuum chamber, comprising:
four elements flexibly and elastically connected one to the other by means of hinges, the hinges defining a parallelogram and being situated in one plane;
at least one drive rod, adapted for moving two opposite hinges with respect to each other along the connection line between both hinges, and for moving two opposite hinges jointly; and
a connector for connecting an object to a hinge.

13. Transfer stage according to claim 12, a drive rod being adapted for both moving two hinges with respect to each other and moving two hinges jointly.

14. Transfer stage according to claim 13, a drive rod being adapted for moving two opposite hinges both with respect to each other and jointly.

15. The lithography system according to claim 1, wherein the hinges are flexible and elastic.

16. The lithography system according to claim 15, wherein the hinges are leaf springs.

17. The lithography system according to claim 1, wherein the drive rods are magnetically connected to the ends of the rods.

18. The lithography system according to claim 1, the first and second drive rods being adapted for moving at substantially equal speeds.

19. The lithography system according to claim 1, wherein said first hinge comprises a corner piece connecting the first rod and the second rod, and wherein the drive rods are adapted for moving said connector in a Y-direction substantially parallel to the longitudinal axes of the drive rods during joint movement of said drive rods, and wherein the drive rods are further adapted for moving said corner piece in an X-direction substantially perpendicular to the longitudinal axes of the drive rods during movement of the drive rods with respect to each other.

20. Transfer stage according to claim 12, wherein said first hinge comprises a corner piece connecting the first rod and the second rod, wherein the drive rods are adapted for moving said corner piece in a Y-direction substantially parallel to said one line during joint movement of said drive rods, and wherein the drive rods are further adapted for moving said corner piece in an X-direction substantially perpendicular to said one line during movement of the drive rods with respect to each other.

* * * * *